US011069801B2

(12) United States Patent
Ejiri

(10) Patent No.: US 11,069,801 B2
(45) Date of Patent: Jul. 20, 2021

(54) SEMICONDUCTOR DEVICE, ELECTRONIC APPARATUS, AND METHOD OF MANUFACTURING SEMICONDUCTOR DEVICE

(71) Applicant: Sony Semiconductor Solutions Corporation, Kanagawa (JP)

(72) Inventor: Hirokazu Ejiri, Kanagawa (JP)

(73) Assignee: Sony Semiconductor Solutions Corporation, Kanagawa (JP)

( * ) Notice: Subject to any disclaimer, the term of this patent is extended or adjusted under 35 U.S.C. 154(b) by 0 days.

(21) Appl. No.: 16/640,906

(22) PCT Filed: Jul. 26, 2018

(86) PCT No.: PCT/JP2018/028118
§ 371 (c)(1),
(2) Date: Feb. 21, 2020

(87) PCT Pub. No.: WO2019/044301
PCT Pub. Date: Mar. 7, 2019

(65) Prior Publication Data
US 2020/0194582 A1 Jun. 18, 2020

(30) Foreign Application Priority Data
Aug. 31, 2017 (JP) .............................. JP2017-166816

(51) Int. Cl.
*H01L 29/78* (2006.01)
*H01L 21/28* (2006.01)
(52) U.S. Cl.
CPC ........ *H01L 29/78* (2013.01); *H01L 21/28079* (2013.01); *H01L 21/28167* (2013.01)
(58) Field of Classification Search
CPC ............... H01L 29/78; H01L 21/28079; H01L 21/28167
See application file for complete search history.

(56) References Cited

U.S. PATENT DOCUMENTS 7,161,203 B2 * 1/2007 Basceri ............. H01L 21/28194
257/296

FOREIGN PATENT DOCUMENTS

| JP | 56-061165 A | 5/1981 |
| JP | 2000-269484 A | 9/2000 |

(Continued)

OTHER PUBLICATIONS

Written Opinion of the International Search Authority of PCT/JP2018/028118; dated Oct. 16, 2018. (Year: 2018).*

*Primary Examiner* — Stephen W Smoot
*Assistant Examiner* — Vicki B. Booker
(74) *Attorney, Agent, or Firm* — Michael Best & Friedrich LLP

(57) ABSTRACT

A semiconductor device, an electronic apparatus, and a method of manufacturing a semiconductor device with reduced RTN influence regardless of gate electrode shape are disclosed. In one example, a semiconductor device includes a substrate having an element region and an element separating region, the element region including a source region and a drain region, and a channel region between the source and drain regions. The element separating region is arranged on both sides in a direction orthogonal to the source, channel and drain region arrangement direction. A gate insulating film is provided on the element region of the substrate from one side to another side of the element separating region. A gate electrode is provided on the gate insulating film, and includes an impurity having a different concentration in a boundary region as compared to a central region.

12 Claims, 15 Drawing Sheets

(56) References Cited

FOREIGN PATENT DOCUMENTS

| | | |
|---|---|---|
| JP | 2012-500485 A | 1/2012 |
| JP | 2013-058505 A | 3/2013 |
| JP | 2017-069231 A | 4/2017 |
| WO | 2017/056740 A1 | 4/2017 |

* cited by examiner

[FIG. 1]
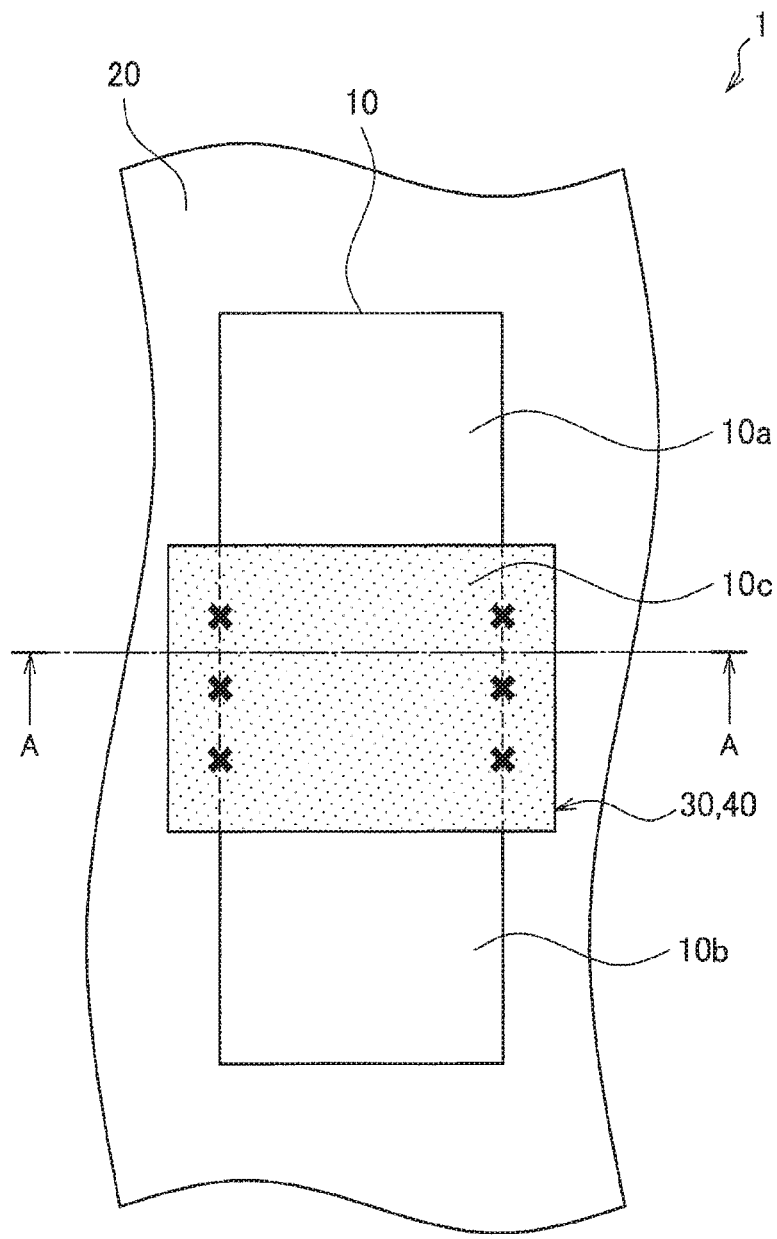

[ FIG. 2 ]
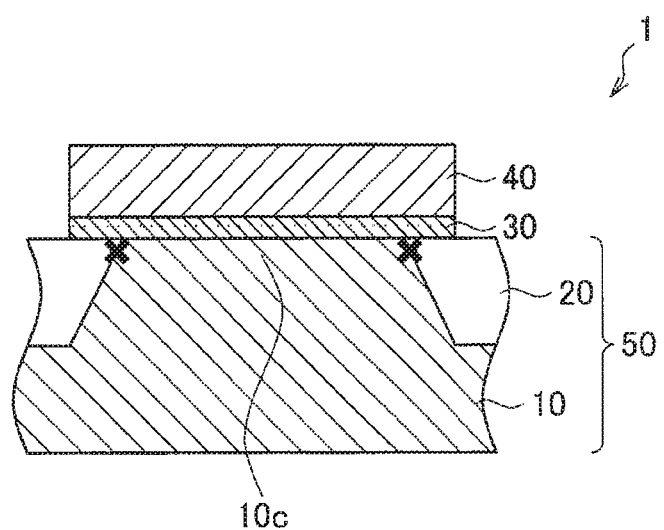

[FIG. 3]
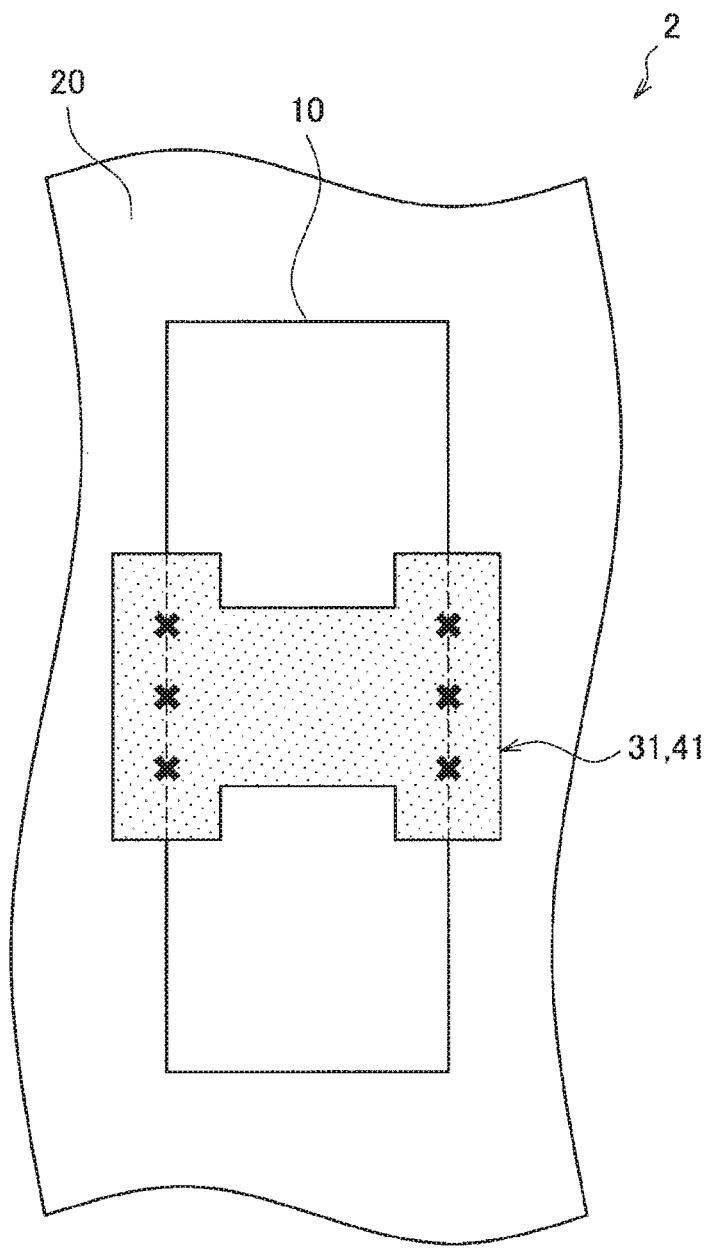

[ FIG. 4 ]
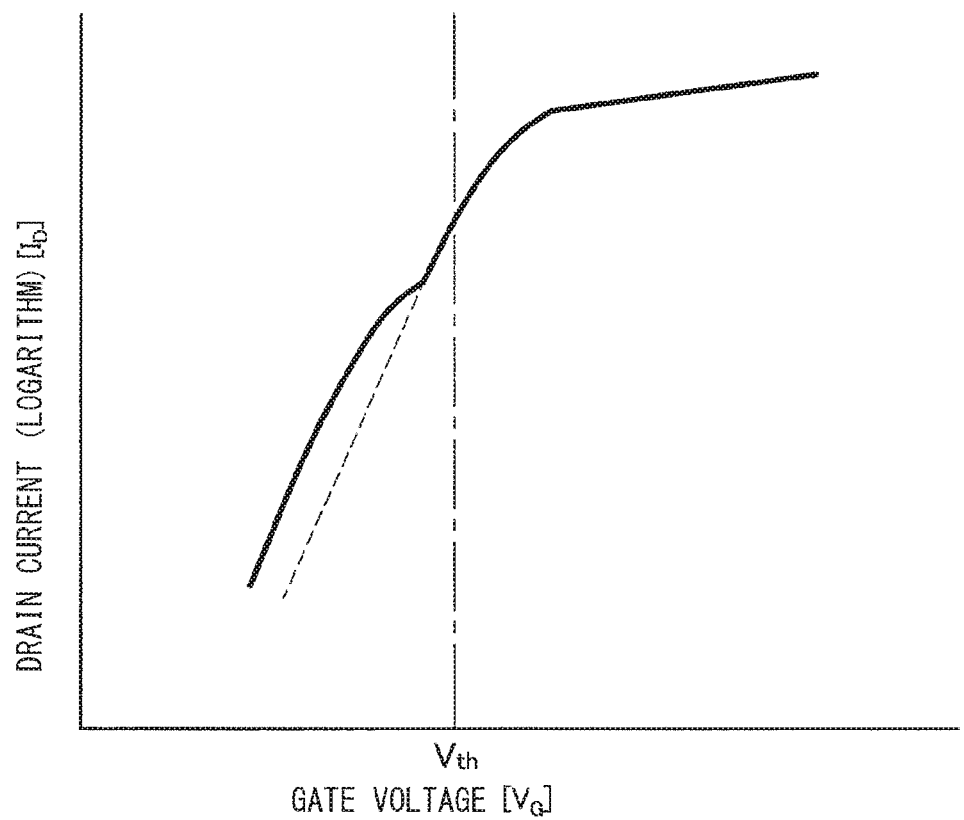

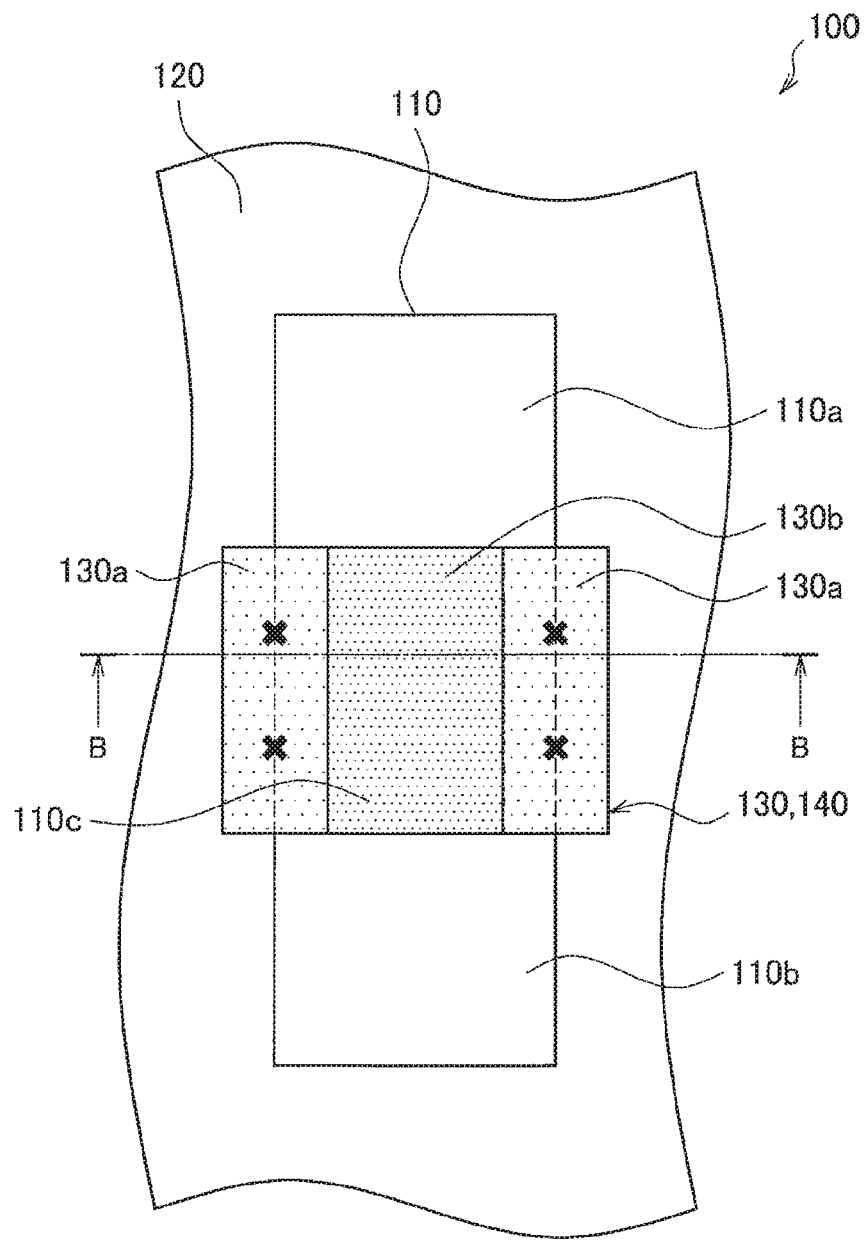
[FIG.5]

[ FIG. 6 ]
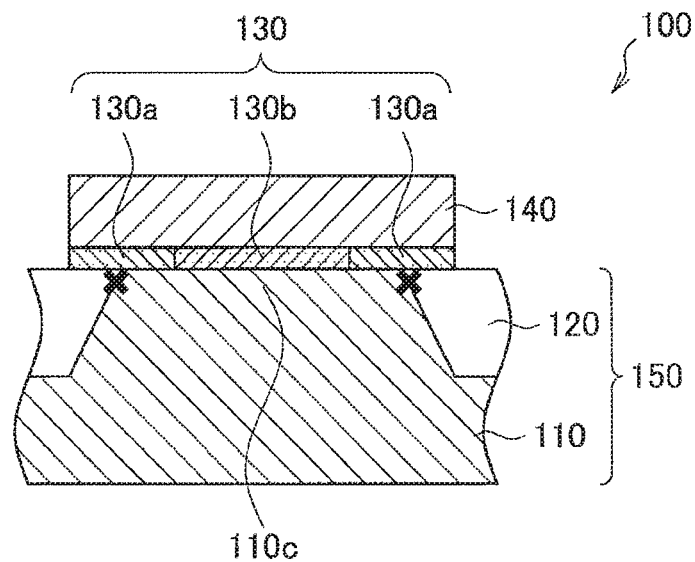
[ FIG. 7 ]
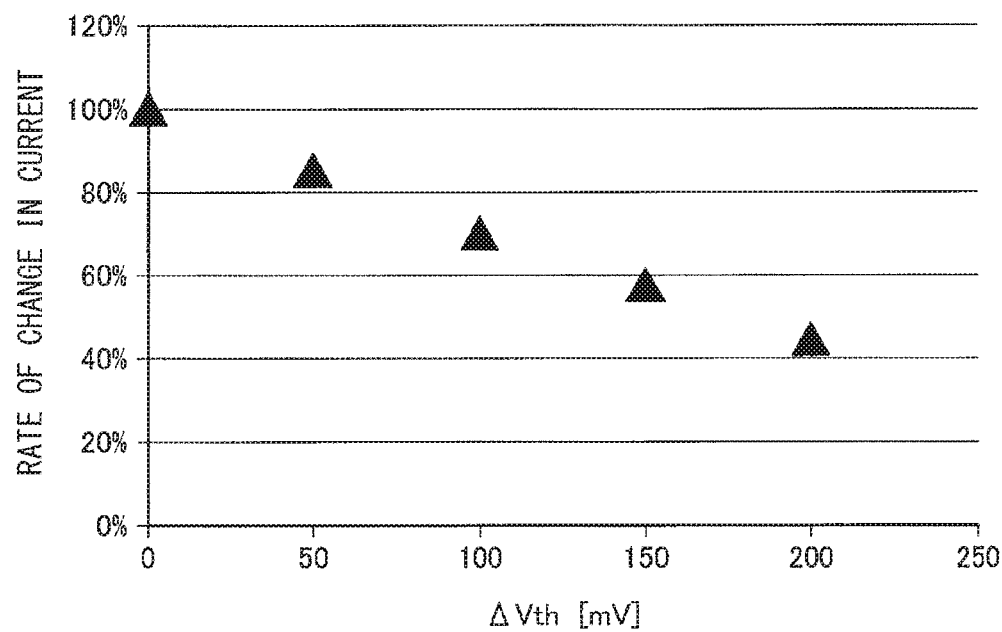

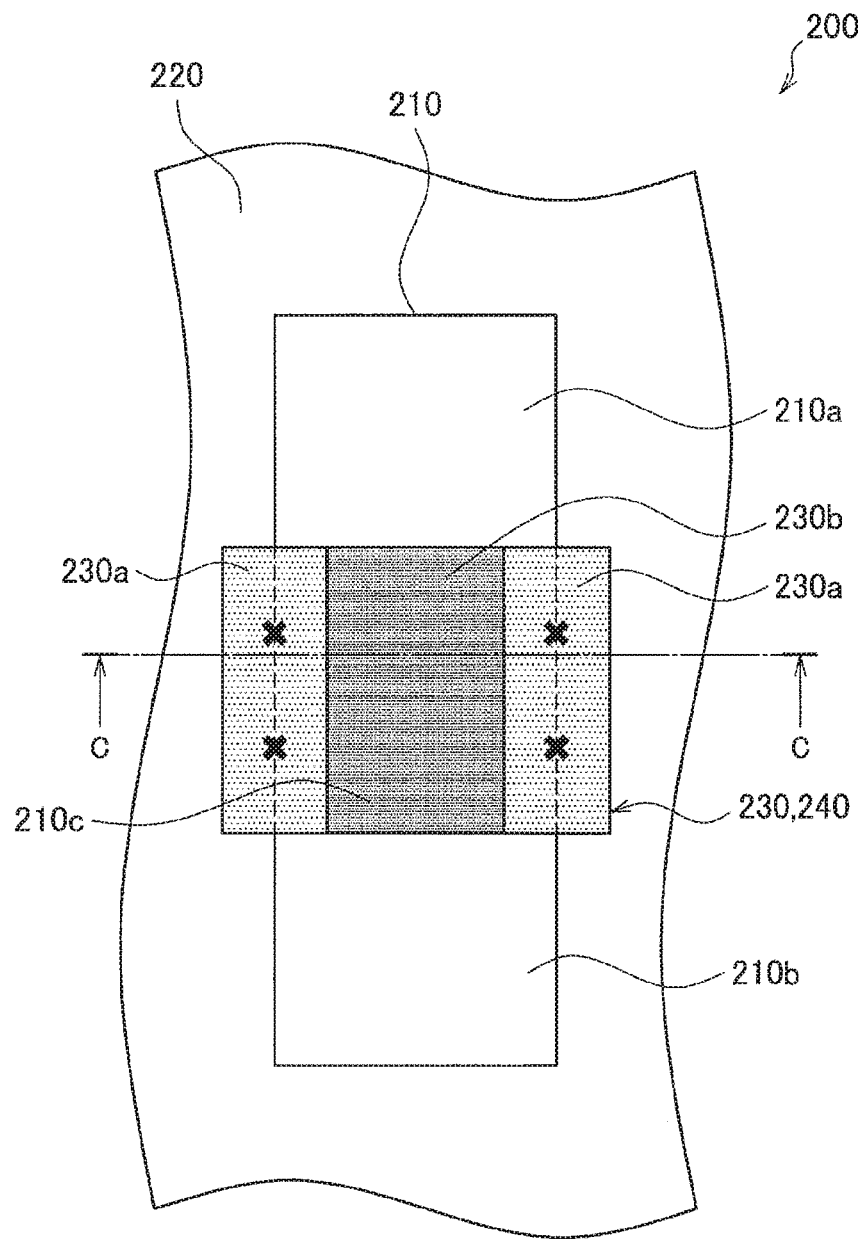
[FIG. 8]

[FIG. 9]
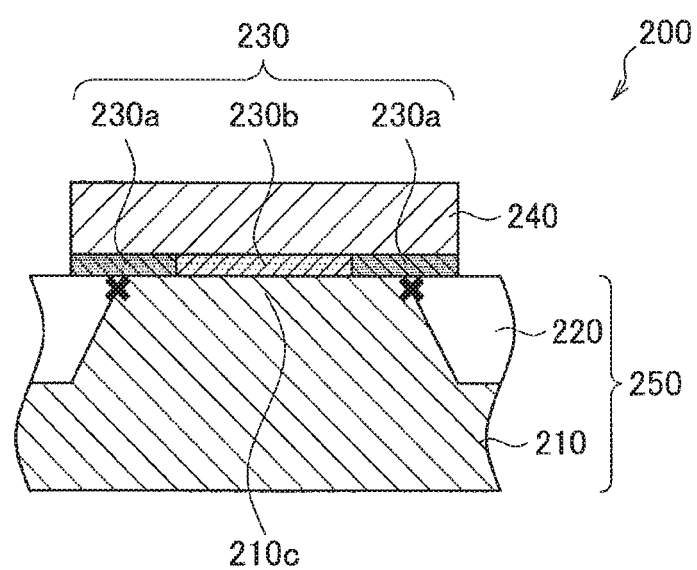

[ FIG. 10 ]
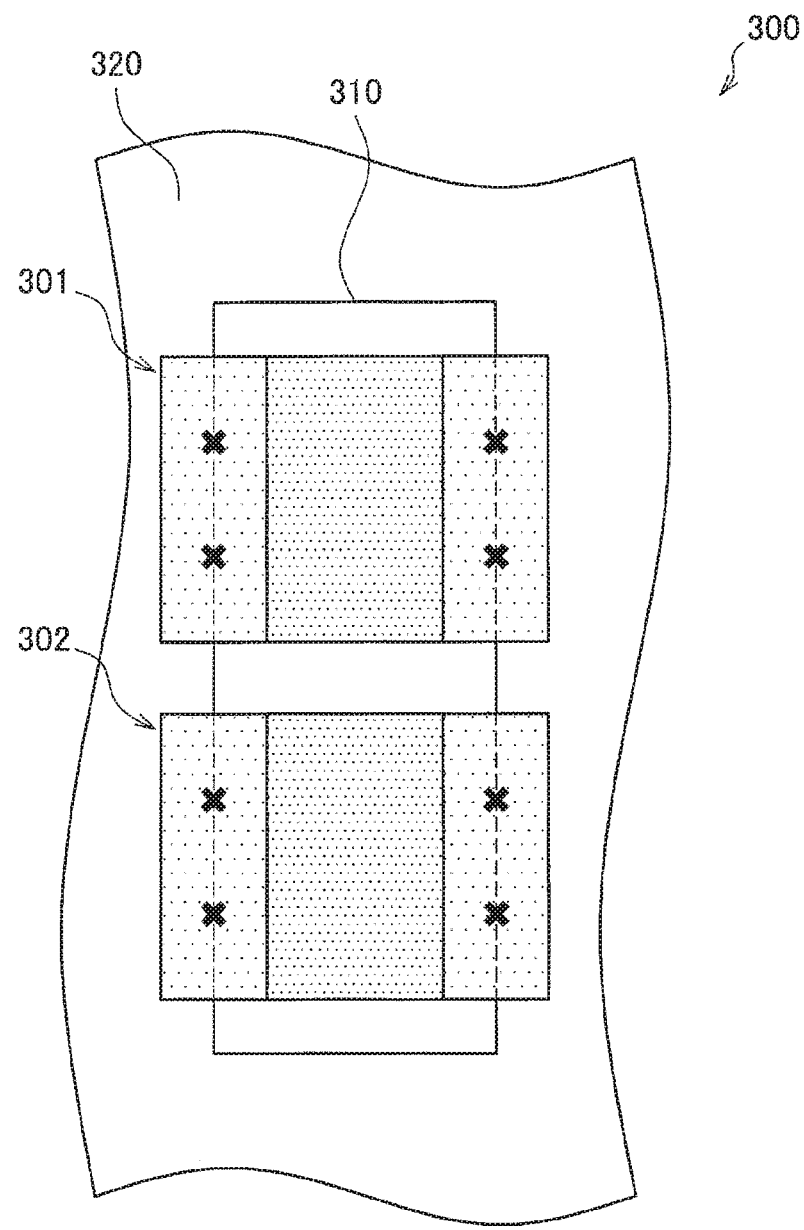
[ FIG. 11A ]
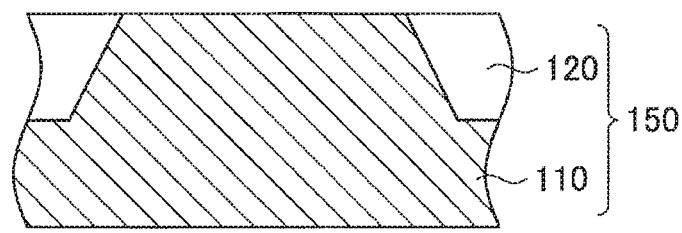

[ FIG. 11B ]
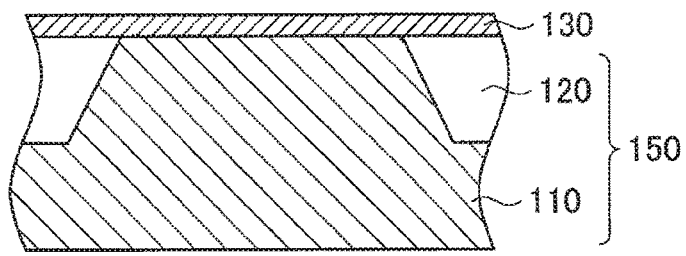
[ FIG. 11C ]
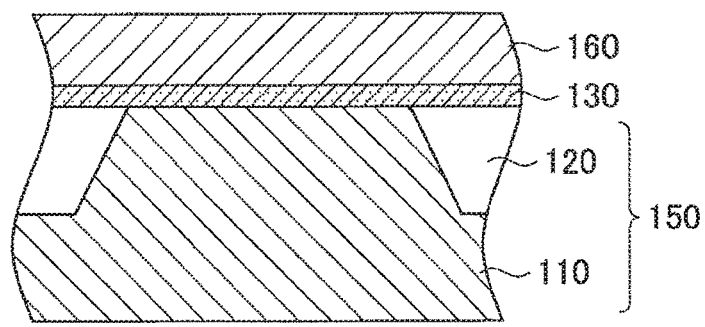
[ FIG. 11D ]
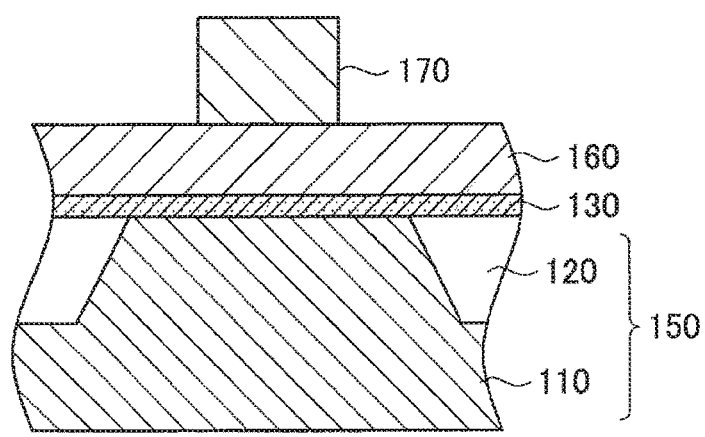
[ FIG. 11E ]
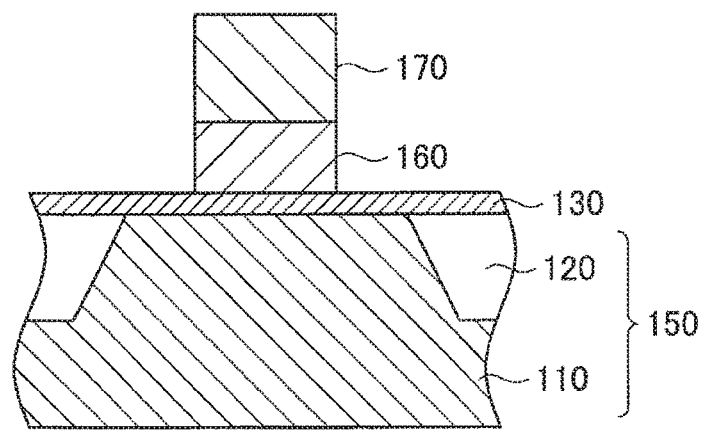

[ FIG. 11F ]
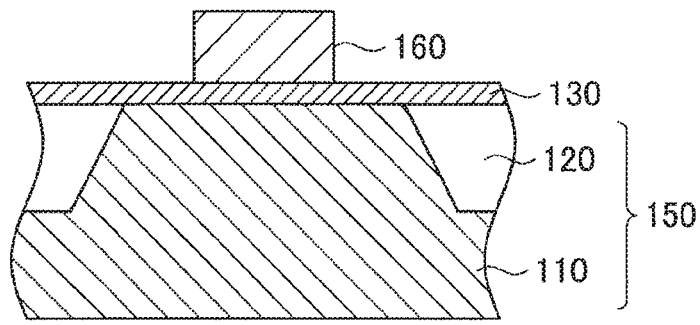
[ FIG. 11G ]
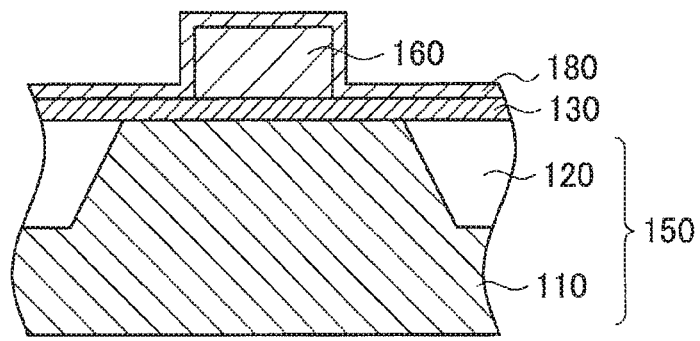
[ FIG. 11H ]
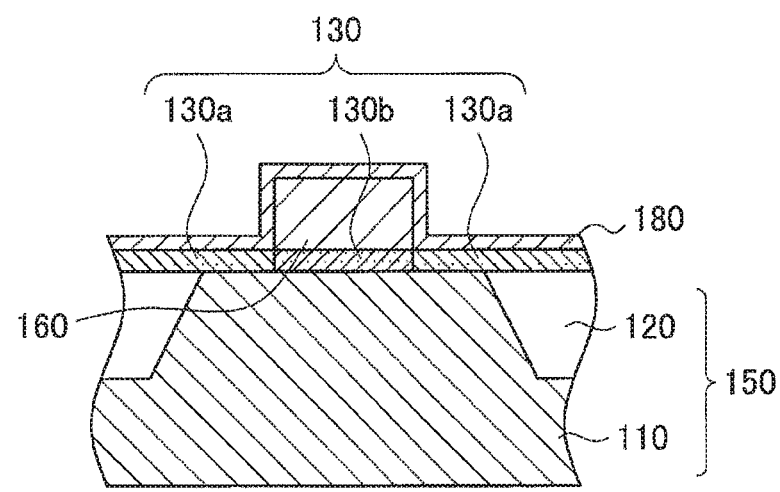

[ FIG. 11I ]
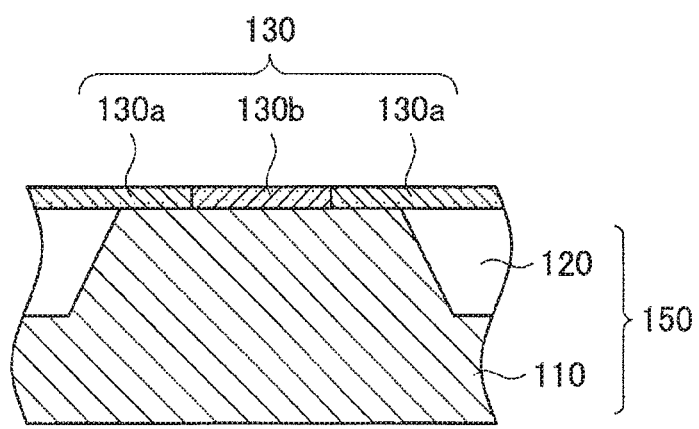
[ FIG. 11J ]
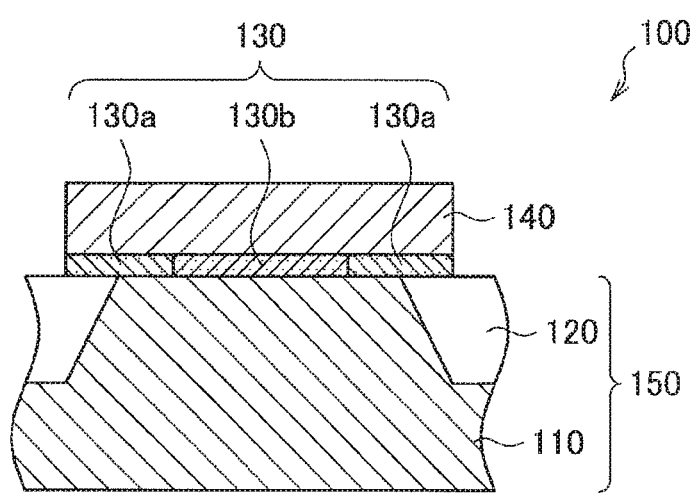

[ FIG. 12 ]
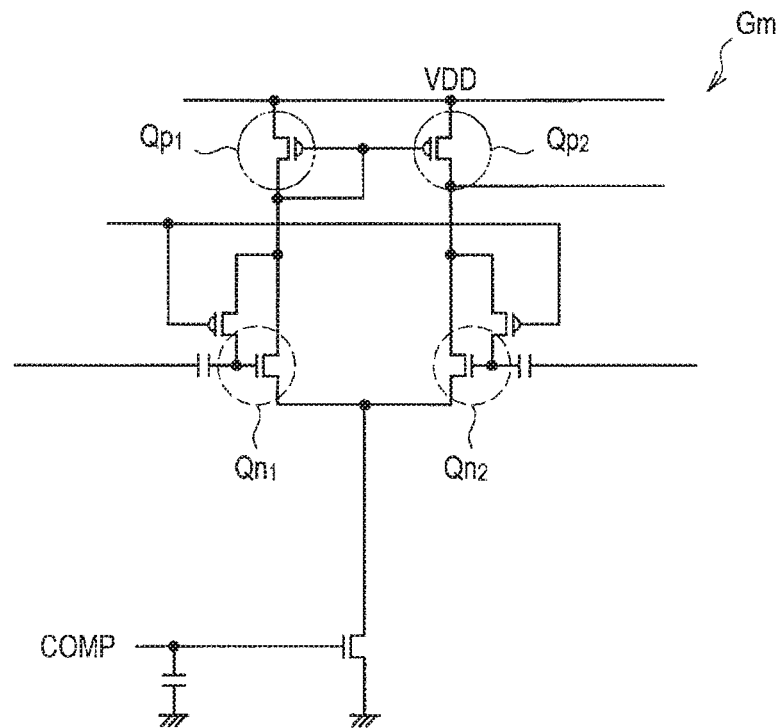
[ FIG. 13 ]
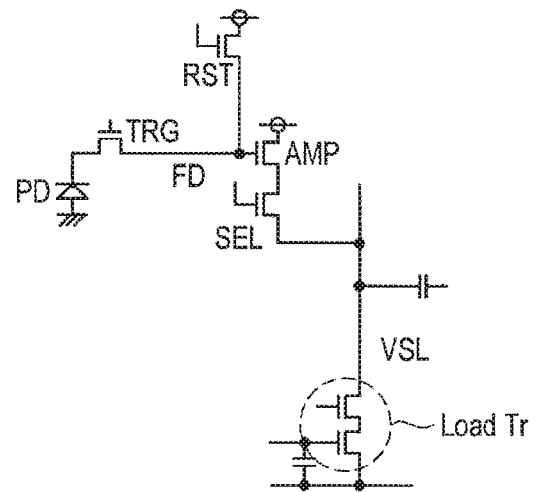

[ FIG. 14A ]
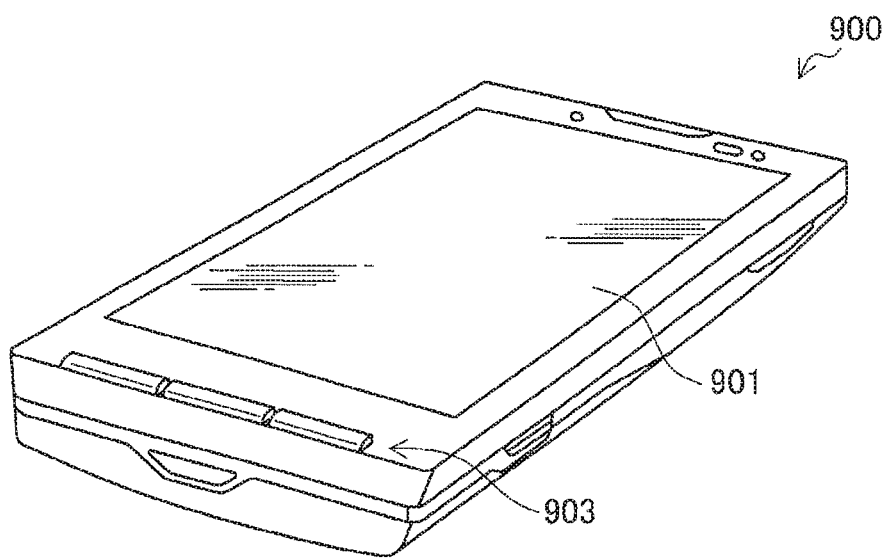
[ FIG. 14B ]
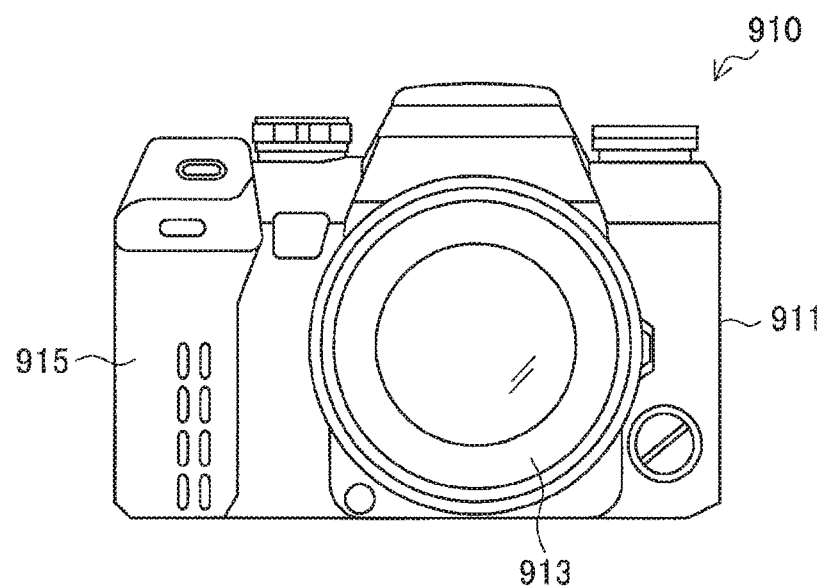

[ FIG. 14C ]
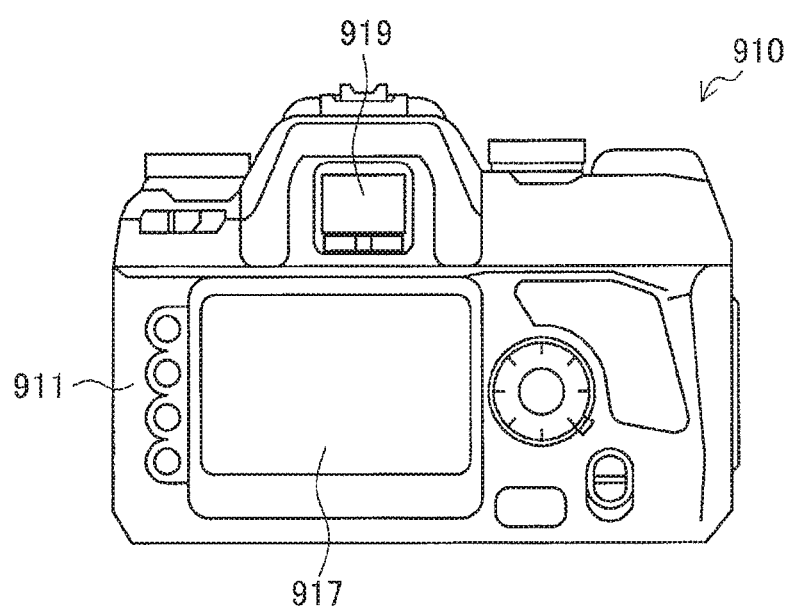

SEMICONDUCTOR DEVICE, ELECTRONIC APPARATUS, AND METHOD OF MANUFACTURING SEMICONDUCTOR DEVICE

TECHNICAL FIELD

The present disclosure relates to a semiconductor device, an electronic apparatus, and a method of manufacturing a semiconductor device.

BACKGROUND ART

As a semiconductor device, a field-effect transistor (Field-Effect Transistor: FET) is known.

The field-effect transistor (hereinafter also simply referred to as the transistor in some cases) includes a gate electrode that is provided on an element region of a semiconductor substrate, and a source region and a drain region that are provided in the element region to sandwich the gate electrode therebetween. In the field-effect transistor, a channel region is formed between the source region and the drain region by applying a voltage to the gate electrode, and carriers (electrons or holes) are caused to move in the formed channel region. This allows a current to flow from the drain region to the source region.

In contrast, in an integrated circuit and the like, the element region in which transistors and the like are formed is separated an element separating region to electrically insulate each of the transistors, and the like from one another. It is possible to form the element separating region using, for example, an STI (Shallow Trench Isolation) method. In the STI method, an opening is formed on a surface of a substrate with use of etching, and the formed opening is filled with an insulating material.

Here, as described in PTL 1, in the field-effect transistor using the STI, noise called RTN (Random Telegraph Noise) is generated in some cases. The RTN is generated by random trapping or detrapping of carriers, and, in particular, is generated in the vicinity of a boundary between the element separating region formed using the STI and the element region. The RTN causes malfunction of the field-effect transistor; therefore, various efforts have been undertaken to suppress the RTN.

The PTL 1 discloses a technology of suppressing an influence of the RTN by changing a shape of the gate electrode. Specifically, in most cases, random movement of carriers that causes the RTN takes place in the vicinity of a boundary between the element separating region and the element region; therefore, in the technology described in the PTL 1, the shape of the gate electrode in a region in the vicinity of the boundary to stretch out in a gate length direction. As a result, a current is less likely to flow in the region in the vicinity of the boundary, which makes it possible to reduce the influence of the RTN.

CITATION LIST

Patent Literature

PTL 1: Japanese Unexamined Patent Application Publication No. 2017-69231

SUMMARY OF THE INVENTION

Problems to be Solved by the Invention

However, in recent years, microfabrication and integration of a semiconductor device have been more desired, and further reduction in size of the field-effect transistor has been desired. The gate electrode having the shape as disclosed in the PTL 1 necessitates a length for stretching out in the gate length direction in addition to the gate length, which has placed limitations on reduction in size of the field-effect transistor. Further, further microfabrication makes it increasingly difficult to achieve complicated shape machining. Accordingly, in the technology described in the PTL 1, suppressing the influence by the RTN is expected to become more difficult.

In view of circumstances described above, it is desirable to reduce the influence by the RTN regardless of the shape of the gate electrode.

Means for Solving the Problems

According to the present disclosure, there is provided a semiconductor device including: a substrate having an element region and an element separating region, the element region including a source region and a drain region and including a channel region present between the source region and the drain region, the element separating region being provided at least on both sides in a direction orthogonal to a direction where the source region, the channel region, and the drain region are arranged; a gate insulating film provided at least on the element region of the substrate from one side to another side of the element separating region; and a gate electrode provided on the gate insulating film, the gate insulating film including an impurity, and having a different concentration of the impurity in a boundary region from a concentration of the impurity in a central region of the gate insulating film, the boundary region including a region on a boundary between the element region and the element separating region.

Further, according to the present disclosure, there is provided an electronic apparatus including: a substrate having an element region and an element separating region, the element region including a source region and a drain region and including a channel region present between the source region and the drain region, the element separating region being provided at least on both sides in a direction orthogonal to a direction where the source region, the channel region, and the drain region are arranged; a gate insulating film provided at least on the element region of the substrate from one side to another side of the element separating region; and a gate electrode provided on the gate insulating film, the gate insulating film including an impurity, and having a different concentration of the impurity in a boundary region from a concentration of the impurity in a central region of the gate insulating film, the boundary region including a region on a boundary between the element region and the element separating region.

Additionally, according to the present disclosure, there is provided a method of manufacturing a semiconductor device, the method including: providing an element region and an element separating region on a substrate, the element separating region being provided at least on both sides of the element region; providing a gate insulating film at least on the element region of the substrate at least from one side to another side of the element separating region; providing a predetermined mask on the gate insulating film; forming a film containing an impurity on the gate insulating film and the mask, and performing heat treatment to diffuse the impurity in the gate insulating film that is not covered by the mask; removing the mask; providing a source region and a drain region with the gate electrode interposed therebetween in the element region.

According to the present disclosure, a threshold voltage is locally changed by locally changing the concentration of the impurity contained in the gate insulating film, which makes it possible to locally change a current flowing in the channel region. In particular, locally changing a current flowing in the vicinity of the boundary between the element region and the element separating region makes it possible to reduce an influence by RTN generated in the vicinity of the boundary between the element region and the element separating region.

Effects of the Invention

As described above, according to the present disclosure, it is possible to reduce the influence by RTN regardless of a shape of the gate electrode.

It is to be noted that the above-described effects are not necessarily limitative. Any of the effects indicated in this description or other effects that may be understood from this description may be exerted in addition to the above-described effects or in place of the above-described effects.

BRIEF DESCRIPTION OF DRAWINGS

FIG. 1 is a simplified plan view of a typical field-effect transistor.

FIG. 2 is an A-A cross-sectional view of the field-effect transistor illustrated in FIG. 1.

FIG. 3 is a plan view of a field-effect transistor according to a comparative example.

FIG. 4 is a characteristic diagram of the field-effect transistor illustrated in FIG. 1 and FIG. 2.

FIG. 5 is a plan view of a configuration of a field-effect transistor according to a first embodiment of the present disclosure.

FIG. 6 is a B-B cross-sectional view of the field-effect transistor illustrated in FIG. 5.

FIG. 7 is a graphic chart of a result of simulating a relationship between a difference in a threshold voltage in a boundary region (a range within 20 nm from a boundary toward a direction of a central region) and a rate of change in a flowing current.

FIG. 8 is a plan view of a configuration of a field-effect transistor according to a second embodiment of the present disclosure.

FIG. 9 is a C-C cross-sectional view of the field-effect transistor illustrated in FIG. 8.

FIG. 10 is a diagram illustrating a modification example of the field-effect transistors according to the first and second embodiments of the present disclosure.

FIG. 11A is a schematic cross-sectional view for describing a process of a method of manufacturing the field-effect transistor according to the first embodiment of the present disclosure.

FIG. 11B is a schematic cross-sectional view for describing a process of the method of manufacturing the same field-effect transistor.

FIG. 11C is a schematic cross-sectional view for describing a process of the method of manufacturing the same field-effect transistor.

FIG. 11D is a schematic cross-sectional view for describing a process of the method of manufacturing the same field-effect transistor.

FIG. 11E is a schematic cross-sectional view for describing a process of the method of manufacturing the same field-effect transistor.

FIG. 11F is a schematic cross-sectional view for describing a process of the method of manufacturing the same field-effect transistor.

FIG. 11G is a schematic cross-sectional view for describing a process of the method of manufacturing the same field-effect transistor.

FIG. 11H is a schematic cross-sectional view for describing a process of the method of manufacturing the same field-effect transistor.

FIG. 11I is a schematic cross-sectional view for describing a process of the method of manufacturing the same field-effect transistor.

FIG. 11J is a schematic cross-sectional view for describing a process of the method of manufacturing the same field-effect transistor.

FIG. 12 is an equivalent circuit diagram illustrating a comparator circuit of an A/D converter to which the technology according to the present disclosure is applied.

FIG. 13 is an equivalent circuit diagram illustrating a pixel circuit of a CIS to which the technology according to the present disclosure is applied.

FIG. 14A is an external view of an example of an electronic apparatus to which the technology of the present disclosure is applicable.

FIG. 14B is an external view of another example of an electronic apparatus to which the technology of the present disclosure is applicable.

FIG. 14C is an external view of still another example of the electronic apparatus to which the technology of the present disclosure is applicable.

MODES FOR CARRYING OUT THE INVENTION

Hereinafter, preferred embodiments of the present disclosure will be described in detail with reference to the attached drawings. It is to be noted that, in the present specification and drawings, component parts having substantially the same functional configurations are denoted with the same reference numerals, and description thereof is not repeated.

It is to be noted that, in the drawings described below, the size of some components may be exaggerated for the sake of explanation. The relative sizes of the components illustrated in the drawings do not necessarily represent the exact size relationships between the actual components. Moreover, in the following description, a direction in which a substrate or a layer is stacked may be referred to as upper direction.

It is to be noted that description is given in the following order.

1. General Description of Field-Effect Transistor
   1.1. Basic Configuration of Field-Effect Transistor
   1.2. Characteristics of Field-Effect Transistor
2. First Embodiment
3. Second Embodiment
4. Modification Example
5. Manufacturing Method
6. Application Examples
   6.1. A/D Converter
   6.2. CIS
   6.3. Electronic Apparatus
7. Conclusion

1. GENERAL DESCRIPTION OF FIELD-EFFECT TRANSISTOR (1.1. Basic Configuration of Field-Effect Transistor)

First, a basic configuration of a field-effect transistor is described with reference to FIG. 1 and FIG. 2. FIG. 1 is a schematic plan view of a planar configuration of a typical field-effect transistor. FIG. 2 is a longitudinal cross-sectional view of a cross-sectional configuration taken along a line A-A of the field-effect transistor illustrated in FIG. 1.

As illustrated in FIG. 1 and FIG. 2, a field-effect transistor 1 includes a semiconductor substrate 50, a source region 10a, a drain region 10b, a channel region 10c, a gate insulating film 30, and a gate electrode 40. It is to be noted that the source region 10a and the drain region 10b may be interchanged with each other.

The semiconductor substrate 50 is, for example, a silicon substrate, and a semiconductor device such as the field-effect transistor 1 is formed on the semiconductor substrate 50. The semiconductor substrate 50 is provided with an element separating region 20 and an element region 10. The element separating region 20 is formed by filling an opening formed by etching with an insulating material. The element region 10 is partitioned by the element separating region 20, and a conductivity-type impurity is introduced into the element region 10. With reference to FIG. 1, the element region 10 has the source region 10a and the drain region 10b, and the channel region 10c is provided between the source region 10a and the drain region 10b. On the channel region 10c, the gate insulating film 30 is provided from one side to another side of the element separating region 20 in a direction orthogonal to a direction where the source region 10a, the drain region 10b, and the channel region 10c are arranged. Further, the gate electrode 40 is provided on the gate insulating film 30.

As illustrated in FIG. 1, in such a field-effect transistor 1, in order to prevent current leakage, crosstalk, and the like, a periphery of the element region 10 is surrounded by the element separating region 20 to electrically insulate each of the field-effect transistors 1.

It is to be noted that the field-effect transistor illustrated in FIG. 1 and FIG. 2 is broadly divided into an N type and a P type depending on types of carriers contributing to a current flowing between the source region 10a and the drain region 10b. In an N-type field-effect transistor, carriers are electrons, and thus a P-type impurity is added to the element region 10, while an N-type impurity is added to the source region 10a and the drain region 10b. In contrast, in a P-type field-effect transistor, carriers are holes, and thus the N-type impurity is added to the element region 10, while the P-type impurity is added to the source region 10a and the drain region 10b.

In such a field-effect transistor, applying a voltage equal to a threshold voltage or higher to the gate electrode 40 causes electrons or holes to move as carriers between the source region 10a and the drain region 10b, thereby allowing a current to flow.

In the field-effect transistor having the above-described configuration, the element separating region 20 that partitions the element region 10 is formed using an STI method. In the vicinity of a boundary between the element separating region 20 that is formed using the STI method and the element region 10, RTN is frequently generated due to carrier trapping. The RTN causes malfunction of the field-effect transistor 1, and therefore various efforts have been undertaken to suppress the RTN.

For example, FIG. 3 is a top view of a planar configuration of a field-effect transistor according to a comparative example (a field-effect transistor disclosed in PTL 1).

As illustrated in FIG. 3, in a field-effect transistor 2 according to the comparative example, reduction in the influence by the RTN is attempted by changing a shape of a gate electrode 41. As described above, carrier trapping occurs frequently mainly in the vicinity of a boundary between the element region 10 and the element separating region 20. Accordingly, in the field-effect transistor 2 according to the comparative example, the gate electrode 41 is configured in a shape of stretching out long in a gate length direction (a direction in which the source region 10a and the drain region 10b are arranged) on the boundary between the element region 10 and the element separating region 20, as illustrated in FIG. 3. According to such a configuration, in the vicinity of the boundary between the element region 10 and the element separating region 20, a current is less likely to flow as compared with a central portion of the gate electrode 41, which makes it possible to reduce electrons to be trapped by carrier trapping. In such a manner, in the field-effect transistor 2 according to the comparative example, reduction in the influence by the RTN is attempted.

However, the gate electrode 41 of the field-effect transistor 2 necessitates a length for stretching out in the gate length direction in addition to the gate length, leading to a disadvantage in achieving microfabrication of a field-effect transistor. In addition, as microfabrication of the field-effect transistor 2 advances, processing on the gate electrode 41 in a complicated shape is expected to become increasing difficult. Accordingly, in a configuration of the field-effect transistor 2 according to the comparative example, as microfabrication of the configuration advances, suppressing the influence by the RTN is expected to become difficult.

(1.2. Characteristics of Field-Effect Transistor)

Here, characteristics of the field-effect transistor 1 illustrated in FIG. 1 and FIG. 2 are described with reference to FIG. 4. FIG. 4 is a graphic chart illustrating a relationship between a voltage ($V_G$) to be applied to a gate and a current ($I_D$) flowing into a drain in the field-effect transistor 1 illustrated in FIG. 1 and FIG. 2.

In FIG. 4, ideal characteristics of the field-effect transistor are indicated with a dashed line, and actual characteristics are indicated with a solid line.

As illustrated in FIG. 4, ideally, a drain current tends to increase constantly with an increase in a gate voltage until the gate voltage reaches a threshold voltage (Vth). However, actually, the drain current may increase above a straight line of an ideal graph, resulting in flowing of a larger amount of the current in some cases. This is caused by a hump. The hump appears in a field-effect transistor with use of the STI method, and is caused structurally by thinning leading to reduction in thickness of an oxide film on an upper edge of an STI structure, a dent in the vicinity of a boundary between an element region and an element separating region, or the like. Appearance of such a hump leads to an increase in characteristic variations around the threshold voltage, deterioration in relative characteristics (referred to as also matching characteristics), and generation of leakage current, resulting in malfunction of the field-effect transistor 1 as with the RTN. Accordingly, suppressing a current flowing in the vicinity of the boundary between the element region and the element separating region to suppress the RTN as described above is also effective in suppressing appearance of the hump.

In view of circumstances described above, the inventor of the present invention has created the technology according to the present disclosure. According to the technology of the present disclosure, it is possible to reduce the RTN regardless of a shape of a gate electrode. Further, according to the technology of the present disclosure, suppression of a current flowing in the vicinity of the boundary between the element region and the element separating region makes it possible to suppress a hump appearing in the characteristics of a field-effect transistor. Hereinafter, a configuration of a field-effect transistor according to an embedment of the present disclosure that exerts such effects is sequentially described in detail.

2. FIRST EMBODIMENT

First, a configuration of a field-effect transistor according to a first embedment of the present disclosure is described with reference to FIG. 5 and FIG. 6. FIG. 5 is a plan view of a configuration of the field-effect transistor according to the present embodiment. FIG. 6 is a cross-sectional view taken along a line B-B of the field-effect transistor illustrated in FIG. 5.

As illustrated in FIG. 5 and FIG. 6, a field-effect transistor 100 according to the present embodiment includes a semiconductor substrate 150 in which an element region 110 and an element separating region 120 are formed, a gate insulating film 130, and a gate electrode 140. The field-effect transistor 100 according to the present embodiment is, for example, an N-type field-effect transistor.

The semiconductor substrate 150 is a substrate in which the field-effect transistor 100 is formed. The semiconductor substrate 150 is provided with the element region 110 and the element separating region 120. The element region 110 includes a source region 110a, a drain region 110b, and a channel region 110c of the field-effect transistor 100. The element separating region 120 partitions the element region 110. Further, on a boundary between the element region 110 and the element separating region 120, carrier trapping may occur in the vicinity of a surface layer of the semiconductor substrate 150. In FIG. 6, typical points at which the carrier trapping occurs frequently are indicated with X marks.

The semiconductor substrate 150 is, for example, a single-crystal silicon (Si) substrate. As an alternative, the semiconductor substrate 150 may be a so-called SOI (Silicon On Insulator) substrate in which an insulating film such as $SiO_2$ is interposed inside the above-described silicon substrate. Further, for example, the semiconductor substrate 150 may use a compound semiconductor substrate such as a gallium arsenide (GaAs) substrate, a gallium nitride (GaN) substrate, or a silicon carbide (SiC) substrate, or may be a substrate in which a semiconductor layer such as silicon (Si) is formed on a substrate that uses a material, such as sapphire, other than semiconductor materials.

The element region 110 is formed by introducing a conductivity-type impurity into the semiconductor substrate 150. The field-effect transistor 100 according to the present embodiment is the N-type field-effect transistor; therefore, the element region 110 is formed by introducing a P-type impurity (boron, aluminum, or the like) into the semiconductor substrate 150 using an ion implantation method or the like.

The element region 110 further includes the source region 110a and the drain region 110b with the gate insulating film 130 and the gate electrode 140 interposed therebetween. The source region 110a and the drain region 110b are formed by introducing an N-type impurity (for example, phosphorous, arsenic, or the like). The element region 110 under the gate insulating film 130 and the gate electrode 140 serves as the channel region 110c.

The element separating region 120 is formed with use of an insulating material, and is provided toward inside from a surface of the semiconductor substrate 150. The element separating region 120 may be formed with use of an insulating inorganic oxynitride such as silicon oxide ($SiO_x$), silicon nitride ($SiN_x$), or silicon oxynitride (SiON). Specifically, it is possible to form the element separating region 120 by removing a portion of the semiconductor substrate 150 in a predetermined region that partitions the element region 110 by etching or the like and thereafter filling an opening formed by etching with silicon oxide ($SiO_x$) or the like with use of the STI (Shallow Trench Isolation) method.

The element separating region 120 electrically insulates the field-effect transistors 100 and the like that are provided in the semiconductor substrate 150 from one another by separating the element regions 110 in the semiconductor substrate 150 from one another. It is to be noted that the element separating region 120 is provided at least on both sides of the element region 110 in a direction orthogonal to a direction in which the source region 110a and the drain region 110b are arranged. As an alternative, the element separating region 120 may be provided to surround a periphery of the element region 110. Surrounding the periphery of the element region 110 by the element separating region 120 makes it possible to further suppress a leakage current from the field-effect transistor 100.

The gate electrode 140 is formed on a gate insulating film using a conductive material. For example, the gate electrode 140 may be formed in a rectangular shape in a plan view that is similar to a shape of the gate insulating film 130 to be described later.

For example, the gate electrode 140 may be formed using polysilicon. In such a case, the gate electrode 140 may be formed as an N-type electrode using polysilicon into which an N-type impurity is introduced. As an alternative, the gate electrode 140 may be formed using a metallic material, and may include, for example, a metal such as titanium (Ti), molybdenum (Mo), tantalum (Ta), tungsten (W), niobium (Nb), nickel (Ni), zirconium (Zr), gold (Au), silver (Ag), aluminum (Al), and copper (Cu), or an alloy or a metallic compound that contains any of these metals. As an alternative, the gate electrode 140 may be formed in a multi-layer structure in which a plurality of kinds of layers that include any of the above-described materials is stacked. According to such a multi-layer structure, it is possible for the gate electrode 140 to achieve effects such as reduction in wiring resistance.

The gate insulating film 130 is provided on the semiconductor substrate 150 to cross over the element region 110 from one side to another side of the element separating region 120. Specifically, the gate insulating film 130 is provided in a rectangular shape in a plan view, and is provided over the element region 110 to cause both ends of the gate insulating film 130 to be present on the element separating region 120. In other words, the gate insulating film 130 may be provided to extend in a direction orthogonal to a direction in which the source region 110a, the channel region 110c, and the drain region 110b are arranged. Thus, the gate insulating film 130 is provided to be present on a boundary between the element region 110 and the element separating region 120.

The gate insulating film 130 may include an inorganic insulating material. For example, the gate insulating film 130 may include an inorganic oxide or an inorganic nitride, and, in particular, may include silicon oxide ($SiO_x$), silicon nitride ($SiN_x$), silicon oxynitride (SiON), aluminum oxide ($Al_2O_3$), titanium oxide ($TiO_2$), or the like. Further, the gate insulating film 130 may include a ferroelectric material or the like. It is possible to form the gate insulating film 130 by forming a film including the inorganic insulating material as described above on the semiconductor substrate 150. In addition, it is also possible to form the gate insulating film 130 by oxidizing a surface of the semiconductor substrate 150.

Here, in the field-effect transistor 100 according to the present embodiment, the gate insulating film 130 includes an impurity in at least a partial region. Specifically, the gate insulating film 130 is provided to cause boundary regions 130a including a region on a boundary between the element region 110 and the element separating region 120 to be different in concentration of the impurity from a central region 130b of the gate insulating film 130. The boundary regions 130a of the gate insulating film 130 are regions in which carrier trapping frequently appears, and regions on both end sides of the gate insulating film 130 that includes the region on the boundary between the element region 110 and the element separating region 120. The concentration of the impurity is different between the boundary regions 130a and the central region 130b of the gate insulating film 130, which makes it possible for the field-effect transistor 100 to locally control magnitude of the threshold voltage in the boundary regions 130a and the central region 130b. This makes it possible for the field-effect transistor 100 according to the present embodiment to increase a local threshold voltage in the boundary regions 130a in which carrier trapping possibly occurs, and to reduce magnitude of a current flowing in the boundary regions 130a. Accordingly, in the field-effect transistor 100 according to the present embodiment, it is possible to reduce the RTN caused by carrier trapping. Further, in the field-effect transistor 100 according to the present embodiment, it is also possible to reduce the hump in the transistor characteristics, which makes it also possible to reduce variations in the transistor characteristics.

The local threshold voltage is controllable on the basis of the type and concentration of the impurity contained in the gate insulating film 130. For example, in the field-effect transistor of the present embodiment, the boundary region 130a including the region on the boundary between the element region 110 and the element separating region 120 may contain the impurity at a higher concentration than the central region 130b.

The above-described impurity contained in the gate insulating film 130 is, for example, a metallic impurity, and specifically is a transition metal such as Hf, Ta, and W, and more specifically is Hf. In particular, Hf is a material typically used in a manufacturing process of a semiconductor, and does not deteriorate reliability significantly even in a case where Hf is contained as an impurity in the gate insulating film 130 and the like, which allows for reduction in manufacturing costs of the field-effect transistor 100. In an N-type field-effect transistor, introduction of such an impurity into the boundary region 130a at a higher concentration than in the central region 130b makes it possible to make the local threshold voltage in the boundary region 130a in which carrier trapping occurs frequently higher than that in the central region 130b. Therefore, in the field-effect transistor 100, the amount of current flowing in the boundary region 130a decreases, which allows for reduction in the RTN caused by carrier trapping. Further, in the field-effect transistor 100, it is also possible to reduce the hump in the transistor characteristics, which makes it also possible to reduce variations in the transistor characteristics.

It is to be noted that, as long as the boundary region 130a is higher in the concentration of the impurity than the central region 130b, the central region 130b may not contain any impurities. According to such a configuration, it is possible to reduce the influence of the RTN in the boundary region 130a without suppressing a current flowing in the central region 130b. Further, according to such a configuration, it is possible to control the local threshold voltage of the field-effect transistor 100 at lower cost by reducing the total amount of the impurity contained in the gate insulating film 130.

For example, in the field-effect transistor 100, Hf may be selected as the impurity, and Hf may be added to the boundary region 130a at a concentration of $1.0 \times 10^{14}$ atoms/$cm^2$. This allows for an increase in the local threshold voltage in the boundary region 130a in which the concentration of Hf is high. Therefore, a current flowing through the boundary region 130a decreases during operation of the field-effect transistor 100, which makes it possible to suppress the hump and reduce of variations in the transistor characteristics. Further, in the field-effect transistor 100, it is possible to reduce the influence of the RTN caused by random trapping or detrapping in carrier trapping.

An effect of a decrease in a flowing current with an increase in a threshold voltage is described with reference to a simulation result illustrated in FIG. 7. FIG. 7 is a graphic chart illustrating a simulation result of a relationship between a difference in a threshold voltage in a boundary region (a range within 20 nm from a boundary toward a direction of a central region) and a rate of change in the flowing current.

As illustrated in FIG. 7, it is seen that, in a case where the threshold voltage is changed in the boundary region (a range within 20 nm from the boundary toward a direction of the central region), a current flowing in the boundary region 130a decreases with an increase in a difference in the threshold voltage. Specifically, it is seen that, in a case where the threshold voltage in the boundary region 130a increases by 100 mV from a reference threshold voltage, the amount of the current flowing in the boundary region 130a decreases to about 70% of the amount of a current obtained at the reference threshold voltage.

It is to be noted that the field-effect transistor 100 according to the present embodiment has been described; however, a certain impurity introduced into the gate insulating film 130 of an N-type field-effect transistor may decrease a local threshold voltage in a region into which such an impurity is introduced. In a case where such an impurity is used, the gate insulating film 130 is provided to cause the concentration of the impurity in the central region 130b to be higher than the concentration of the impurity in the boundary region 130a. With such a configuration, it is also possible to make the local threshold voltage in the boundary region 130a higher than the local threshold voltage in the central region 130b, which allows the field-effect transistor 100 to reduce the current flowing in the boundary region 130a. In such an N-type field-effect transistor, examples of an impurity that decreases the local threshold voltage in a region into which such an impurity is introduced may include an alkali metal or an alkali-earth metal such as Sr and Ba.

3. SECOND EMBODIMENT

Next, a configuration of a field-effect transistor according to a second embodiment of the present disclosure is described with reference to FIG. 8 and FIG. 9. FIG. 8 is a plan view of the configuration of the field-effect transistor according to the present embodiment. FIG. 9 is a C-C cross-sectional view of the field-effect transistor illustrated in FIG. 8.

A field-effect transistor 200 according to the present embodiment is different from the field-effect transistor 100 according to the first embodiment mainly in that the field-effect transistor 200 is a P-type field-effect transistor. In the field-effect transistor 200 according to the present embodiment, configurations other than an element region 210 and a gate insulating film 230 are substantially similar to configurations having the same names described in the first embodiment; therefore, description thereof is simplified here.

As illustrated in FIG. 8, the field-effect transistor 200 according to the present embodiment includes a semiconductor substrate 250 in which the element region 210 and an element separating region 220 are formed, the gate insulating film 230, and a gate electrode 240. The field-effect transistor 200 according to the present embodiment is the P-type field-effect transistor as described above.

The semiconductor substrate 250 is a substrate in which the field-effect transistor 200 and the like are formed. The semiconductor substrate 250 is, for example, a single-crystal silicon (Si) substrate. The semiconductor substrate 250 is provided with the element region 210 and the element separating region 220. The element region 210 includes a source region 210a, a drain region 210b, and a channel region 210c of the field-effect transistor 200. The element separating region 220 partitions the element region 210. Further, on a boundary between the element region 210 and the element separating region 220, carrier trapping may occur in the vicinity of a surface layer of the semiconductor substrate 250. In FIG. 9, typical points at which the carrier trapping occurs frequently are indicated with X marks.

The element region 210 is formed by introducing a conductivity-type impurity into the semiconductor substrate 250. The field-effect transistor 200 according to the present embodiment is the P-type field-effect transistor; therefore, the element region 210 is formed by introducing an N-type impurity (phosphorus, arsenic, or the like) into the semiconductor substrate 250 using an ion implantation method or the like.

The element region 210 further includes the source region 210a and the drain region 210b with the gate insulating film 230 and the gate electrode 240 interposed therebetween. The source region 210a and the drain region 210b are formed by introducing a P-type impurity (for example, boron, aluminum, or the like). The element region 210 under the gate insulating film 230 and the gate electrode 240 serves as the channel region 210c.

The element separating region 220 is formed with use of an insulating material, and is provided toward inside from a surface of the semiconductor substrate 250. The element separating region 220 may be formed with use of an insulating inorganic oxynitride such as silicon oxide ($SiO_x$), silicon nitride ($SiN_x$), or silicon oxynitride (SiON). The element separating region 220 electrically insulates the field-effect transistor 200 and the like that are provided in the semiconductor substrate 250 from one another by separating the element regions 210 in the semiconductor substrate 250 from one another. It is to be noted that the element separating region 220 is provided at least on both sides of the element region 210 in a direction orthogonal to a direction in which the source region 210a and the drain region 210b are arranged. As an alternative, the element separating region 220 may be provided to surround a periphery of the element region 210.

The gate electrode 240 is formed on the gate insulating film 230 using a conductive material. For example, the gate electrode 240 may be formed in a rectangular shape in a plan view that is similar to a shape of the gate insulating film 230 to be described later. For example, the gate electrode 240 may be formed using polysilicon. In such a case, the gate electrode 240 may be formed as a P-type electrode using polysilicon into which a P-type impurity is introduced. As an alternative, the gate electrode 240 may be formed using a metallic material.

The gate insulating film 230 may include an inorganic insulating material. For example, the gate insulating film 230 may include an inorganic oxide or an inorganic nitride.

Here, in the field-effect transistor 200 according to the present embodiment, the gate insulating film 230 includes an impurity in at least a partial regions, as with the first embodiment. Specifically, the gate insulating film 230 is provided to cause a central region 230b of the gate insulating film 230 to be higher in concentration of the impurity than a boundary region 230a including a region on a boundary between the element region 210 and the element separating region 220. The above-described impurity contained in the gate insulating film 230 is, for example, a metallic impurity, and specifically is a transition metal such as Hf, Ta, W, Ti, or Zr, or a bas metal such as Al, and more specifically is Hf In other words, in the field-effect transistor 200 according to the present embodiment, carriers are holes; therefore, unlike the first embodiment where carriers are electrons, a relative relationship in the concentration of the impurity contained in the gate insulating film 230 between the boundary region 230a and the central region 230b are reversed.

Accordingly, in a P-type field-effect transistor, introduction of the impurity into the central region 230b at a higher concentration than in the boundary region 230a makes it possible to make the local threshold voltage in the boundary region 230a in which carrier trapping occurs lower than that in the central region 230b. Therefore, in the field-effect transistor 200, the amount of current flowing in the boundary region 230a during operation decreases, which allows for reduction in the RTN caused by carrier trapping. Further, in the field-effect transistor 200, it is also possible to reduce the hump in the transistor characteristics, which makes it also possible to reduce variations in the transistor characteristics.

It is to be noted that, as long as the central region 230b is higher in the concentration of the impurity than the boundary region 230a, the boundary region 230a may not contain any impurities. According to such a configuration, it is possible to control the local threshold voltage of the field-effect transistor 200 at lower cost by reducing the total amount of the impurity contained in the gate insulating film 230.

However, a certain impurity introduced into the gate insulating film 230 of a P-type field-effect transistor may decrease a local threshold voltage in a region into which such an impurity is introduced. In a case where such an impurity is used, the gate insulating film 230 is provided to cause the concentration of the impurity in the boundary region 230a to be higher than concentration of the impurity in the central region 230b. With such a configuration, it is also possible to make the local threshold voltage in the boundary region 230a lower than the local threshold voltage in the central region 230b, which allows the field-effect transistor 200 to reduce the current flowing in the boundary region 230a. In such a P-type field-effect transistor, examples of an impurity that decreases the local threshold voltage in a region into which such an impurity is introduced may include an alkali metal or an alkali-earth metal such as Sr and Ba.

Thus far, the field-effect transistors according to the first and second embodiments have been described in detail.

4. MODIFICATION EXAMPLE

Next, a modification example of the field-effect transistors according to the first and second embodiments of the present disclosure is described with reference to FIG. 10. FIG. 10 is a plan view of a configuration of field-effect transistors according to the present modification example.

As illustrated in FIG. 10, a plurality of field-effect transistors 301 and 302 according to the present modification example may be provided in one element region 310 surrounded by an element separating region 320. For example, in a case where the field-effect transistors 301 and 302 are coupled in series to each other (that is, in a case where a source of the field-effect transistor 302 is coupled to a drain of the field-effect transistor 301), it is possible to provide the plurality of field-effect transistors in the element region 310. It is to be noted that the technology according to the present disclosure may be applied to at least one of the field-effect transistor 301 or the field-effect transistor 302.

5. MANUFACTURING METHOD

Next, a method of manufacturing the field-effect transistor 100 according to the first embodiment is described with reference to FIG. 11A to FIG. 11J. Each of FIG. 11A to FIG. 11J is a schematic cross-sectional view for describing a process of the method of manufacturing the field-effect transistor 100 according to the present embodiment.

Hereinafter, description is given of the method of manufacturing the field-effect transistor 100 according to the first embodiment (that is, the N-type field-effect transistor). A method of manufacturing the field-effect transistor 200 according to the second embodiment (that is, the P-type field-effect transistor) is substantially similar, except that a location into which an impurity is introduced is different, and description thereof is therefore omitted.

First, as illustrated in FIG. 11A, the element region 110 is formed by introducing an N-type impurity into the semiconductor substrate 150, and thereafter the element separating region 120 is formed using the STI method. Specifically, the element region 110 is formed by introducing the N-type impurity (phosphorous or arsenic) into a predetermined region of the semiconductor substrate 150 including silicon with use of the ion implantation method. Thereafter, the element separating region 120 is formed by forming an opening that surrounds the element region 110 by etching and filling the formed opening with an insulating material such as silicon oxide.

Next, as illustrated in FIG. 11B, the gate insulating film 130 is formed over an entire surface of the semiconductor substrate 150. Specifically, the gate insulating film 130 including $SiO_2$ or the like is formed by oxidizing a surface layer of the entire surface of the semiconductor substrate 150.

Subsequently, as illustrated in FIG. 11C, a mask 160 is formed as a film on the gate insulating film 130. Specifically, the mask 160 is formed by forming a film including TiN or TaN over the entire surface of the semiconductor substrate 150. A film thickness of the mask 160 may be, for example, within a range of 10 nm to 50 nm.

Next, as illustrated in FIG. 11D, a photoresist film 170 is formed on the mask 160, and the photoresist film 170 is patterned. Specifically, first, the photoresist film 170 is formed on the mask 160 using a spin coating method or the like. Thereafter, the photoresist film 170 is patterned using a photolithography method to remove the photoresist film 170 in a region other than a region corresponding to the central region 130b of the gate insulating film 130. Here, the region corresponding to the central region 130b of the gate insulating film 130 is a region that does not include a region on a boundary between the element region 110 and the element separating region 120.

It is to be noted that FIG. 11D illustrates the method of manufacturing the field-effect transistor 100 according to the first embodiment that is of the N-type. In contrast, the field-effect transistor 200 according to the second embodiment that is of the P-type is different in a region in which the photoresist film 170 remains. Specifically, in the field-effect transistor 200, the photoresist film 170 is patterned to remain in the boundary region 230a including a region on a boundary between the element region 210 and the element separating region 220. In other words, in the field-effect transistor 200, the region in which the photoresist film 170 remains is reversed from that in the field-effect transistor 100.

Subsequently, as illustrated in FIG. 11E, dry etching is performed to selectively remove the mask 160 in a region other than a region covered with the photoresist film 170. Specifically, the mask 160 in the region not covered with the photoresist film 170 is removed selectively using, for example, reactive gas etching, ion-beam etching, or the like.

Further, as illustrated in FIG. 11F, the photoresist film 170 is peeled off using oxygen plasma or the like.

Thereafter, as illustrated in FIG. 11G, an impurity introduction film 180 containing a metal impurity is formed on the gate insulating film 130 and the mask 160. Specifically, an Hf film or an Hf compound film is formed as the impurity introduction film 180 on the gate insulating film 130 and the mask 160 over the entire surface of the semiconductor substrate 150 using an ALD (Atomic Layer Deposition) method.

Further, as illustrated in FIG. 11H, an impurity contained in the impurity introduction film 180 is diffused in the gate insulating film 130 using heat treatment. Specifically, Hf contained in the impurity introduction film 180 may be diffused in the central region 130b of the gate insulating film 130 using an RTA (Rapid Thermal Anneal) at 650° C. to 950° C. for ten seconds to one minute.

Thereafter, as illustrated in FIG. 11I, the gate insulating film 130 and the mask 160 are removed using wet treatment. Specifically, the gate insulating film 130 and the mask 160 are peeled off from the semiconductor substrate 150 by wet cleaning treatment using an aqueous solution containing HCl and $H_2O_2$, an aqueous solution containing $H_2SO_4$ and $H_2O_2$, or the like.

Subsequently, as illustrated in FIG. 11J, the gate electrode 140 is formed by forming a gate conductive film on the gate insulating film 130 and thereafter patterning the gate insulating film 130 and the gate conductive film. Specifically, the gate conductive film including polysilicon is formed on the gate insulating film 130, and thereafter an N-type impurity (for example, phosphorous, arsenic, or the like) is introduced into the gate conductive film. Thereafter, it is possible to form the gate insulating film 130 and the gate electrode 140 in a predetermined region by performing lithography and etching on the gate insulating film 130 and the gate conductive film.

Further, although not illustrated, the source region 110a and the drain region 110b are formed by introducing an N-type impurity (for example, phosphorous, arsenic, or the like) into the element region 110 in a direction toward a paper plane of FIG. 11A to FIG. 11J. The processes described above make it possible to form the field-effect transistor 100.

It is to be noted that, in addition to the above-described manufacturing processes, in the field-effect transistor 100, an LDD (Lightly-Doped Drain) region, and a side wall or the like for formation of the LDD region may be formed to relax an electric field in the vicinity of a drain.

Thereafter, formation of an interlayer insulating film, planarization of a front surface of the interlayer insulating film, electrode extraction from the source region 110a, the drain region 110b, the gate electrode 140, and the like, and wiring formation from the electrode are carried out to embed the field-effect transistor 100. Thus, a semiconductor device that includes the field-effect transistor 100 is formed.

In the above-described manufacturing method, introduction of the impurity into the gate insulating film 130 is performed by thermal diffusion from the impurity introduction film 180; however, the technology according to the present disclosure is not limited to the above-described method. For example, it is also possible to perform introduction of the impurity into the gate insulating film 130 by sputtering.

6. APPLICATION EXAMPLES

Next, description is given of application examples of any of the field-effect transistors according to the respective embodiments of the present disclosure. The technology according to the present disclosure allows for reduction in RTN acting as a noise source, and is therefore applicable specifically to a circuit using analog signals in which an influence by noise appears prominently. Such application examples are described with reference to FIG. 12 and FIG. 13.

(6.1. Application to A/D Converter)

Any of the field-effect transistors according to the respective embodiments of the present disclosure is applicable to, for example, an A/D converter, as illustrated in FIG. 12. FIG. 12 is an equivalent circuit diagram illustrating a comparator circuit of the A/D converter to which the technology according to the present disclosure is applied.

As illustrated in FIG. 12, an amplifier Gm serving as a first-stage circuit of an A/D converter has differential pair transistors Qn1 and Qn2 each of which includes an N-type field-effect transistor. A source common connection node of the differential pair transistors Qn1 and Qn2 is coupled to a constant-potential side power source through a current source COMP. Further, P-type field-effect transistors Qp1 and Qp2 are provided on a power source VDD side. The P-type field-effect transistors Qp1 and Qp2 configure a current mirror circuit. Any of the field-effect transistors according to the respective embodiments of the present disclosure may be applied to any of those field-effect transistors Qn1, Qn2, Qp1, and Qp2.

According to any of the field-effect transistors according to the respective embodiments of the present disclosure, it is possible to reduce variations and noise of field-effect transistors that form a comparator, which allows for improvement in accuracy of the comparator. Thus, according to any of the field-effect transistors according to the respective embodiments of the present disclosure, it is possible to achieve an A/D converter with higher accuracy. For example, in a CIS (CMOS Image Sensor) or the like, such an A/D converter is an important circuit for conversion of an analog signal obtained from each pixel into a digital signal.

(6.2. Application to CIS)

Any of the field-effect transistors according to the respective embodiments of the present disclosure is applicable to, for example, a pixel circuit of the CIS, as illustrated in FIG. 13. FIG. 13 is an equivalent circuit diagram illustrating the pixel circuit of the CIS to which the technology according to the present disclosure is applied.

As illustrated in FIG. 13, in the pixel circuit of the CIS, a transfer transistor TRG transfers electrons accumulated in a photodiode PD to a floating diffusion FD to activate an amplifier transistor AMP. The amplifier transistor AMP is activated by electrons accumulated in the floating diffusion FD, and causes a current corresponding to the electrons accumulated in the floating diffusion FD to flow from a drain to a source. A selection transistor SEL selectively extract, by switching, a signal amplified by the amplifier transistor AMP. A reset transistor RST sets or resets a potential of the floating diffusion FD to a predetermined value by discharging the electrons in the floating diffusion FD. A signal extracted from each pixel is outputted to a vertical signal line VSL, and the vertical signal line VSL is coupled to a constant current source through a transistor Load Tr. For example, any of the field-effect transistors according to the respective embodiments of the present disclosure may be applied to the amplifier transistor AMP, the selective transistor SEL, or the transistor Load Tr.

Applying any of the field-effect transistors according to the respective embodiments of the present disclosure to the amplifier transistor AMP or the selective transistor SEL makes it possible to reduce variations in sensitivity among pixels that are caused by variations in characteristics among field-effect transistors. Further, according to any of the field-effect transistors according to the respective embodiments of the present disclosure, it is possible to reduce random noise that is possibly generated in the amplifier transistor AMP, which makes it possible to achieve a CIS pixel circuit with higher quality.

Further, applying any of the field-effect transistors according to the respective embodiments of the present disclosure to the transistor Load Tr makes it possible to suppress any variations among the vertical signal lines VSL and to reduce image noise caused by noise that is possibly generated in the vertical signal lines VSL. Thus, according to any of the field-effect transistors according to the respective embodiments of the present disclosure, it is possible to achieve a CIS pixel circuit with higher quality.

(6.3. Application to Electronic Apparatus)

Further, any of the field-effect transistors according to the respective embodiments of the present disclosure is applicable to any of transistors in circuits mounted on a variety of electronic apparatuses. Subsequently, examples of the electronic apparatuses to which any of the field-effect transistors according to the respective embodiments of the present disclosure is applicable are described with reference to FIG. 14A to FIG. 14C. Each of FIG. 14A to FIG. 14C is an external view of an example of the electronic apparatus to which any of the field-effect transistors according to the respective embodiments of the present disclosure is applicable.

For example, any of the field-effect transistors according to the respective embodiments of the present disclosure is applicable to a transistor in a circuit mounted on an electronic apparatus such as a smartphone. Specifically, as illustrated in FIG. 14A, a smartphone 900 includes a display section 901 that displays various types of information, and an operating section 903 including a button or the like for receiving an input from a user. Here, any of the field-effect transistors according to the respective embodiments of the present disclosure may be applied to a transistor in a control circuit that controls various operations of the smartphone 900.

For example, any of the field-effect transistors according to the respective embodiments of the present disclosure is applicable to a transistor in a circuit mounted on an electronic apparatus such as a digital camera. Specifically, as illustrated in FIG. 14B and FIG. 14C, a digital camera 910 includes a main body section (a camera body) 911, an interchangeable lens unit 913, a grip 915 to be gripped by the user at the time of photographing, a monitor section 917 that displays various types of information, and an EVF (Electronic View Finder) 919 that displays a through image viewed by the user at the time of photographing. It is to be noted that FIG. 14B is an external view of the digital camera 910 as seen from the front side (i.e., a subject side), and FIG. 14C is an external view of the digital camera 910 as seen from the back side (i.e., a photographer side). Here, any of the field-effect transistors according to the respective embodiments of the present disclosure may be applied to a transistor in a control circuit that controls various operations of the digital camera 910.

It is to be noted that the electronic apparatus to which any of the field-effect transistors according to the respective embodiments of the present disclosure is applied is not limited to the above-described examples. Any of the field-effect transistors according to the respective embodiments of the present disclosure is applicable to any of transistors in circuits mounted on electronic apparatuses in every field. As examples of such electronic apparatuses, it is possible to exemplify a glass-shaped wearable device, an HMD (Head-Mounted Display), a television apparatus, an electronic book, a PDA (Personal Digital Assistant), a notebook personal computer, a video camera, a gaming console, or the like.

7. CONCLUSION

As described above, in any of the field-effect transistors according to the respective embodiments of the present disclosure, it is possible to control a local threshold voltage by controlling the concentration of an impurity contained in the gate insulating film in the central region and the boundary region. This allows the field-effect transistor according to the present embodiment to reduce a current flowing in the vicinity of a boundary between the element region and the element separating region, which makes it possible to reduce an influence by the RTN regardless of the shape of the gate electrode. Further, according to any of the field-effect transistors according to the respective embodiments of the present disclosure, it is possible to suppress a hump appearing in characteristics of the field-effect transistor by suppressing a current flowing in the vicinity of the boundary between the element region and the element separating region.

A preferred embodiment(s) of the present disclosure has/have been described above in detail with reference to the accompanying drawings, but the technical scope of the present disclosure is not limited to such an embodiment(s). It is apparent that a person having ordinary skill in the art of the present disclosure may arrive at various alterations and modifications within the scope of the technical idea described in the appended claims, and it is understood that such alterations and modifications naturally fall within the technical scope of the present disclosure.

Furthermore, the effects described herein are merely illustrative and exemplary, and not limitative. That is, the technology according to the present disclosure may exert other effects that are apparent to those skilled in the art from the description herein, in addition to the above-described effects or in place of the above-described effects.

It is to be noted that the following configurations also fall within the technical scope of the present disclosure.

(1)

A semiconductor device including:

a substrate having an element region and an element separating region, the element region including a source region and a drain region and including a channel region present between the source region and the drain region, the element separating region being provided at least on both sides in a direction orthogonal to a direction where the source region, the channel region, and the drain region are arranged;

a gate insulating film provided at least on the element region of the substrate from one side to another side of the element separating region; and a gate electrode provided on the gate insulating film, the gate insulating film including an impurity, and having a different concentration of the impurity in a boundary region from a concentration of the impurity in a central region of the gate insulating film, the boundary region including a region on a boundary between the element region and the element separating region.

(2)

The semiconductor device according to (1), in which the impurity includes a metallic impurity.

(3)

The semiconductor device according to (2), in which the metallic impurity includes Hf, Ta, W, Zr, or Al.

(4)

The semiconductor device according to (3), in which the metallic impurity includes Hf.

(5)

The semiconductor device according to any one of (1) to (4), in which the element region is of an N type, and the concentration of the impurity in the boundary region of the gate insulating film is higher than the concentration of the impurity in the central region of the gate insulating film.

(6)

The semiconductor device according to (5), in which the central region of the gate insulating film does not contain the impurity.

(7)

The semiconductor device according to any one of (1) to (4), in which the element region is of a P type, and the concentration of the impurity in the central region of the gate insulating film is higher than the concentration of the impurity in the boundary region of the gate insulating film.

(8)

The semiconductor device according to (7), in which the boundary region of the gate insulating film does not contain the impurity.

(9)

The semiconductor device according to any one of (1) to (8), in which the element region is surrounded by the element separating region.

(10)

The semiconductor device according to any one of (1) to (9), in which a planar shape of each of the gate insulating film and the gate electrode is rectangular.

(11)

An electronic apparatus including:

a substrate having an element region and an element separating region, the element region including a source region and a drain region and including a channel region present between the source region and the drain region, the element separating region being provided at least on both sides in a direction orthogonal to a direction where the source region, the channel region, and the drain region are arranged;

a gate insulating film provided at least on the element region of the substrate from one side to another side of the element separating region; and a gate electrode provided on the gate insulating film, the gate insulating film including an impurity, and having a different concentration of the impurity in a boundary region from a concentration of the impurity in a central region of the gate insulating film, the boundary region including a region on a boundary between the element region and the element separating region.

(12)

A method of manufacturing a semiconductor device, the method including:

providing an element region and an element separating region on a substrate, the element separating region being provided at least on both sides of the element region;

providing a gate insulating film at least on the element region of the substrate at least from one side to another side of the element separating region;

providing a predetermined mask on the gate insulating film;

forming a film containing an impurity on the gate insulating film and the mask, and performing heat treatment to diffuse the impurity in the gate insulating film that is not covered by the mask;

removing the mask;

providing a gate electrode on the gate insulating film; and providing a source region and a drain region with the gate electrode interposed therebetween in the element region.

REFERENCE NUMERAL LIST 100, 200, 301, 302: field-effect transistor
110, 210, 310: element region
110a, 210a: source region
110b, 210b: drain region
120, 220, 320: element separating region
130, 230: gate insulating film
130a, 230a: boundary region
130b, 230b: central region
140, 240: gate electrode
150, 250: semiconductor substrate
160: mask
170: photoresist film
180: impurity introduction film

The invention claimed is:

1. A semiconductor device comprising:

a substrate having an element region and an element separating region, the element region including a source region and a drain region and including a channel region present between the source region and the drain region, the element separating region being provided at least on both sides in a direction orthogonal to a direction where the source region, the channel region, and the drain region are arranged;

a gate insulating film provided at least on the element region of the substrate from one side to another side of the element separating region; and a gate electrode provided on the gate insulating film, the gate insulating film including an impurity, and having a different concentration of the impurity in a boundary region from a concentration of the impurity in a central region of the gate insulating film, the boundary region including a region on a boundary between the element region and the element separating region.

2. The semiconductor device according to claim 1, wherein the impurity comprises a metallic impurity.

3. The semiconductor device according to claim 2, wherein the metallic impurity comprises Hf, Ta, W, Zr, or Al.

4. The semiconductor device according to claim 3, wherein the metallic impurity comprises Hf.

5. The semiconductor device according to claim 1, wherein the element region is of an N type, and the concentration of the impurity in the boundary region of the gate insulating film is higher than the concentration of the impurity in the central region of the gate insulating film.

6. The semiconductor device according to claim 5, wherein the central region of the gate insulating film does not contain the impurity.

7. The semiconductor device according to claim 1, wherein the element region is of a P type, and the concentration of the impurity in the central region of the gate insulating film is higher than the concentration of the impurity in the boundary region of the gate insulating film.

8. The semiconductor device according to claim 7, wherein the boundary region of the gate insulating film does not contain the impurity.

9. The semiconductor device according to claim 1, wherein the element region is surrounded by the element separating region.

10. The semiconductor device according to claim 1, wherein a planar shape of each of the gate insulating film and the gate electrode is rectangular.

11. An electronic apparatus comprising:

a substrate having an element region and an element separating region, the element region including a source region and a drain region and including a channel region present between the source region and the drain region, the element separating region being provided at least on both sides in a direction orthogonal to a direction where the source region, the channel region, and the drain region are arranged;

a gate insulating film provided at least on the element region of the substrate from one side to another side of the element separating region; and a gate electrode provided on the gate insulating film, the gate insulating film including an impurity, and having a different concentration of the impurity in a boundary region from a concentration of the impurity in a central region of the gate insulating film, the boundary region including a region on a boundary between the element region and the element separating region.

12. A method of manufacturing a semiconductor device, the method comprising:
- providing an element region and an element separating region on a substrate, the element separating region being provided at least on both sides of the element region;
- providing a gate insulating film at least on the element region of the substrate at least from one side to another side of the element separating region;
- providing a predetermined mask on the gate insulating film;
- forming a film containing an impurity on the gate insulating film and the mask, and performing heat treatment to diffuse the impurity in the gate insulating film that is not covered by the mask;
- removing the mask;
- providing a gate electrode on the gate insulating film; and
- providing a source region and a drain region with the gate electrode interposed therebetween in the element region.

* * * * *